(12) United States Patent
Gros-Jean

(10) Patent No.: US 9,525,019 B2
(45) Date of Patent: Dec. 20, 2016

(54) METHOD FOR MANUFACTURING A POLYCRYSTALLINE DIELECTRIC LAYER

(71) Applicant: STMicroelectronics (Crolles 2) SAS, Crolles (FR)

(72) Inventor: Mickael Gros-Jean, Grenoble (FR)

(73) Assignee: STMICROELECTRONICS (CROLLES 2) SAS, Crolles (FR)

(*) Notice: Subject to any disclaimer, the term of this patent is extended or adjusted under 35 U.S.C. 154(b) by 468 days.

(21) Appl. No.: 14/036,519

(22) Filed: Sep. 25, 2013

(65) Prior Publication Data

US 2014/0021586 A1    Jan. 23, 2014

Related U.S. Application Data

(62) Division of application No. 13/338,766, filed on Dec. 28, 2011, now Pat. No. 8,667,654.

(51) Int. Cl.

| | |
|---|---|
| *H01G 4/06* | (2006.01) |
| *H01G 4/20* | (2006.01) |
| *H01L 49/02* | (2006.01) |
| *C23C 16/40* | (2006.01) |
| *C23C 16/455* | (2006.01) |
| *H01G 4/08* | (2006.01) |
| *H01G 4/12* | (2006.01) |
| *H01G 4/33* | (2006.01) |
| *H01L 21/02* | (2006.01) |

(52) U.S. Cl.
CPC ............. *H01L 28/40* (2013.01); *C23C 16/405* (2013.01); *C23C 16/45529* (2013.01); *C23C 16/45542* (2013.01); *H01G 4/085* (2013.01); *H01G 4/1209* (2013.01); *H01G 4/33* (2013.01); *H01L 21/0228* (2013.01); *H01L 21/02189* (2013.01); *H01L 21/02274* (2013.01); *Y10T 29/42* (2015.01); *Y10T 29/43* (2015.01); *Y10T 29/435* (2015.01)

(58) Field of Classification Search
CPC .............. H01G 4/30; H01G 4/20; H01G 4/10; H01L 28/40; H01L 28/56
USPC .............................. 361/311, 312, 313, 321.1
See application file for complete search history.

(56) References Cited

U.S. PATENT DOCUMENTS

| | | |
|---|---|---|
| 3,625,848 A | 12/1971 | Snaper |
| 3,951,728 A | 4/1976 | Egashira et al. |
| 6,139,964 A | 10/2000 | Sathrum et al. |
| 6,631,070 B2 | 10/2003 | Schmidt et al. |
| 7,501,291 B2 | 3/2009 | Gros-Jean et al. |
| 7,749,563 B2 | 7/2010 | Zheng et al. |
| 2002/0119250 A1 | 8/2002 | Campana et al. |
| 2003/0017266 A1 | 1/2003 | Basceri et al. |
| 2006/0094185 A1 | 5/2006 | Jeong et al. |
| 2007/0048953 A1* | 3/2007 | Gealy ............... C23C 16/45529 438/305 |
| 2008/0017954 A1 | 1/2008 | Suzuki et al. |

(Continued)

*Primary Examiner* — Eric Thomas
*Assistant Examiner* — Arun Ramaswamy
(74) *Attorney, Agent, or Firm* — Seed IP Law Group LLP

(57) ABSTRACT

A method manufactures a capacitor having polycrystalline dielectric layer between two metallic electrodes. The dielectric layer is formed by a polycrystalline growth of a dielectric metallic oxide on one of the metallic electrodes. At least one polycrystalline growth condition of the dielectric oxide is modified during the formation of the polycrystalline dielectric layer, which results in a variation of the polycrystalline properties of the dielectric oxide within the thickness of said layer.

21 Claims, 2 Drawing Sheets

(56) References Cited

U.S. PATENT DOCUMENTS

2008/0160712 A1* 7/2008 Park .................. H01G 4/10
 438/381
2011/0014359 A1 1/2011 Hashim et al.

* cited by examiner

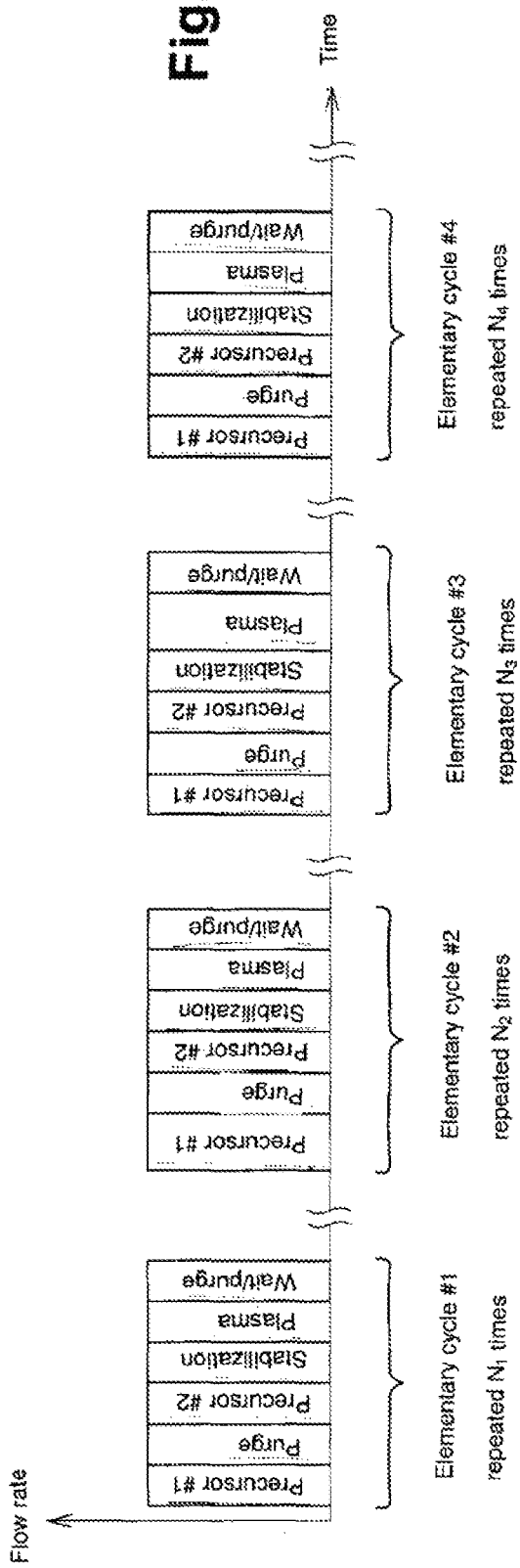
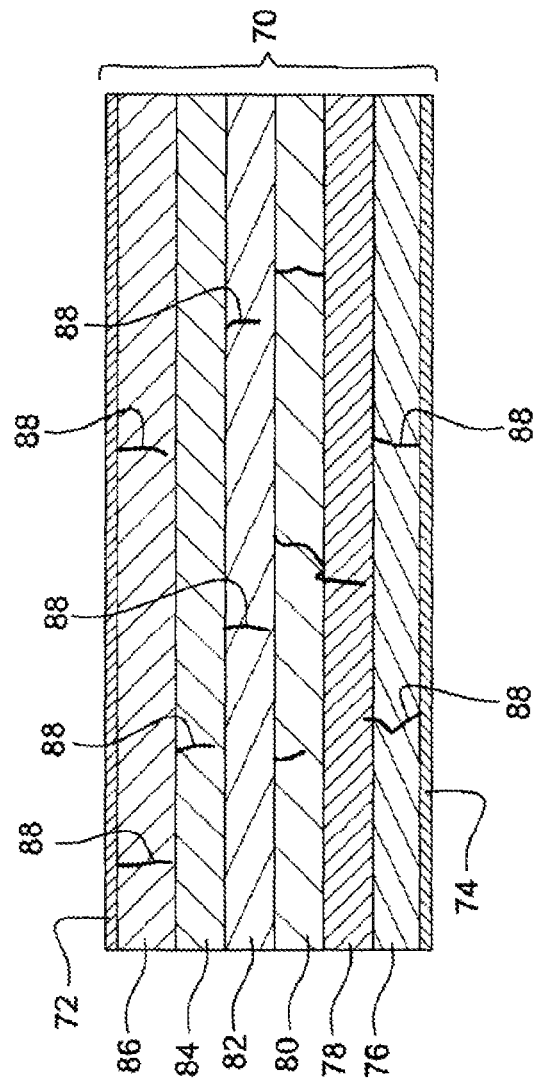

METHOD FOR MANUFACTURING A POLYCRYSTALLINE DIELECTRIC LAYER

BACKGROUND

Technical Field

The disclosure relates to the field of manufacturing a polycrystalline dielectric layer on metal and, more especially, manufacturing a dielectric capacitor layer inserted between two metal electrodes.

Description of the Related Art

Dielectric layers that have a high dielectric constant have many applications, especially in compact, high-capacitance capacitors.

The dielectric constant of a dielectric material depends not only on the atoms of which it is made but also on the spatial arrangement of the molecules relative to each other. For example, zirconium oxide ($ZrO_2$) has a dielectric constant equal to 18 in its amorphous form, i.e. a form that has no particular structure, and a dielectric constant of 45 when it has a tetragonal or cubic crystalline structure.

One way of increasing the capacitance of a capacitor without increasing the volume of its dielectric layer is therefore to produce the latter in a crystalline form.

The form and final geometry of a crystalline structure depend on the crystal germination conditions and hence on the geometrical and chemical structure of the surface on which it is manufactured. However, crystalline growth of a dielectric material is tricky when growth takes place on metal. In fact, the metal may induce a "polycrystalline" form of the dielectric material, i.e. a dielectric material that is formed by juxtaposed crystals. The interface between these crystals is usually referred to as the "grain boundary".

The term "polycrystalline" denotes a material comprising crystals that may be embedded in a matrix of dielectric material that has not crystallized, i.e. an amorphous dielectric material. There are therefore different crystallization rates depending on the total volume of crystals, given that the crystallization rate is defined as the ratio of the volume of crystals to the total volume of material. The dielectric constant of a dielectric material increases as its crystallization rate increases. In practice, a dielectric layer that has the highest possible degree of crystallization is therefore sought after.

Since a polycrystalline form implies the presence of grain boundaries, grain boundaries that extend through the entire thickness of the dielectric layer are very frequently observed. Such grain boundaries, referred to as "penetrating grain boundaries" in the rest of this document, constitute preferential leakage paths for electrons and this is extremely detrimental. In the case of a capacitor, in particular, this means that penetrating grain boundaries electrically connect the two electrodes of the capacitor. In addition, it has also been observed that the existence of a penetrating grain boundary substantially reduces the latter's electrical breakdown voltage.

In order to prevent the occurrence of penetrating grain boundaries, an interlayer made of an amorphous dielectric material is provided in the median plane of the dielectric layer. For example, a dielectric layer with no penetrating grain boundaries comprises a stack formed by a layer of amorphous alumina ($Al_2O_3$) placed between two layers of polycrystalline $ZrO_2$. Although the alumina layer prevents the occurrence of penetrating grain boundaries, it nevertheless significantly limits polycrystalline growth of the $ZrO_2$, thereby lowering the final crystallization rate of the $ZrO_2$ layers and consequently also reducing the total dielectric constant of the dielectric layer. Thus, with such a structure, the maximum dielectric constant that can be achieved is 20.

Inserting an amorphous dielectric layer in order to prevent the occurrence of penetrating grain boundaries therefore defeats the first object referred to above, namely obtaining a polycrystalline structure that has the highest possible dielectric constant.

BRIEF SUMMARY

One embodiment of the present disclosure is a method for manufacturing a dielectric layer with a high dielectric constant, having a polycrystalline structure and formed on a metal, which limits, or even prevents, the formation of penetrating grain boundaries.

One embodiment of the disclosure is a method for manufacturing a capacitor formed by a polycrystalline dielectric layer having a crystallization rate greater than 70 percent and inserted between two metal electrodes with the dielectric layer being formed by polycrystalline growth of a single predetermined dielectric metallic oxide on one of the metal electrodes, wherein said method comprises performing polycrystalline growth cycles forming respective thicknesses of the polycrystalline dielectric layer, and wherein at least one growth condition of the dielectric metallic oxide is modified so as to from one of the growth cycles to a subsequent one of the growth cycles, with crystallization rate variation between thicknesses of the polycrystalline dielectric layer formed by two successive polycrystalline growth cycles being less than 10 percent.

The "crystallization rate" is the volume of crystals per unit of volume.

A "single dielectric metallic oxide" means an oxide whose stoichiometric ratio is the same in the whole polycrystalline dielectric layer. More particularly, all crystals, or <<grains>>, are constituted by the same dielectric metallic oxide with a single stoichiometric ratio.

In other words, the arrangement of the crystals relative to each other and/or their size is also modified by modifying a growth condition of the dielectric layer. More particularly, a new polycrystalline growth begins, that is to say growth of existing crystals is stopped and growth of new crystals begins, the new crystals stacking up the existing crystals.

Thus, the probability is low of a grain boundary formed through the entire thickness of the polycrystalline dielectric material manufactured by applying the new growth conditions being superposed on a grain boundary formed through the entire thickness of the polycrystalline dielectric material already manufactured by applying the previous growth conditions. If the conditions are modified several times, the probability is virtually zero of there being superposed grain boundaries that ultimately form a penetrating grain boundary.

Thanks to the disclosure, one can obtain in a simple manner one dielectric layer which is constituted by a single dielectric metallic oxide, which has a great crystallization rate, which is substantially homogenous regarding crystallization rate, and without a through-grain boundary. Such layer has a dielectric constant greater than 35 while being free of current leakage paths.

Also, it should be noted that the method involves modifying one or more operating parameters while implementing a single growth process.

One embodiment thus generally concerns a method for manufacturing a capacitor formed by a polycrystalline dielectric layer inserted between two metal electrodes with the dielectric layer being formed by polycrystalline growth of a predetermined dielectric metallic oxide on one of the metal electrodes wherein at least one growth condition of the dielectric oxide is modified during formation of the polycrystalline dielectric layer so as to obtain variation of the polycrystalline properties of the dielectric oxide through the thickness of said layer.

In one embodiment of the disclosure, the dielectric layer is produced by Plasma Enhanced Atomic Layer Deposition (PEALD) which comprises a succession of elementary deposition cycles, each consisting of a phase in which the metal precursor of the dielectric oxide is fed in and a phase in which a plasma is applied, and the at least one modified polycrystalline growth condition comprises the time for which the metal precursor of the dielectric layer is fed in.

In another embodiment of the disclosure, the dielectric layer is produced by plasma enhanced atomic layer deposition which comprises a succession of elementary deposition cycles, each including a phase in which the metal precursor of the dielectric oxide is fed in and a phase in which a plasma is applied, and the at least one modified polycrystalline growth condition comprises a condition that relates to a property of the plasma and/or the time for which the plasma is applied.

In one embodiment of the disclosure, the, or each, polycrystalline growth condition is modified regularly so as to obtain a succession of strata each having a thickness of less than 5 nanometers and preferably a thickness substantially equal to 1 nanometer.

In one embodiment of the disclosure the dielectric material is $ZrO_2$ or $HfO_2$ or $SrTiO_3$.

BRIEF DESCRIPTION OF THE SEVERAL VIEWS OF THE DRAWINGS

The disclosure and its advantages will be made more readily understandable by the following description which relates to the accompanying drawings in which identical references denote identical or analogous components and in which:

FIG. 3 is a schematic timing diagram showing the various phases of PEALD in one embodiment of the disclosure; and FIG. 4 is a schematic cross-sectional view of a dielectric layer inserted between two metal electrodes and produced according to one embodiment of the disclosure.

DETAILED DESCRIPTION

Figure 1:
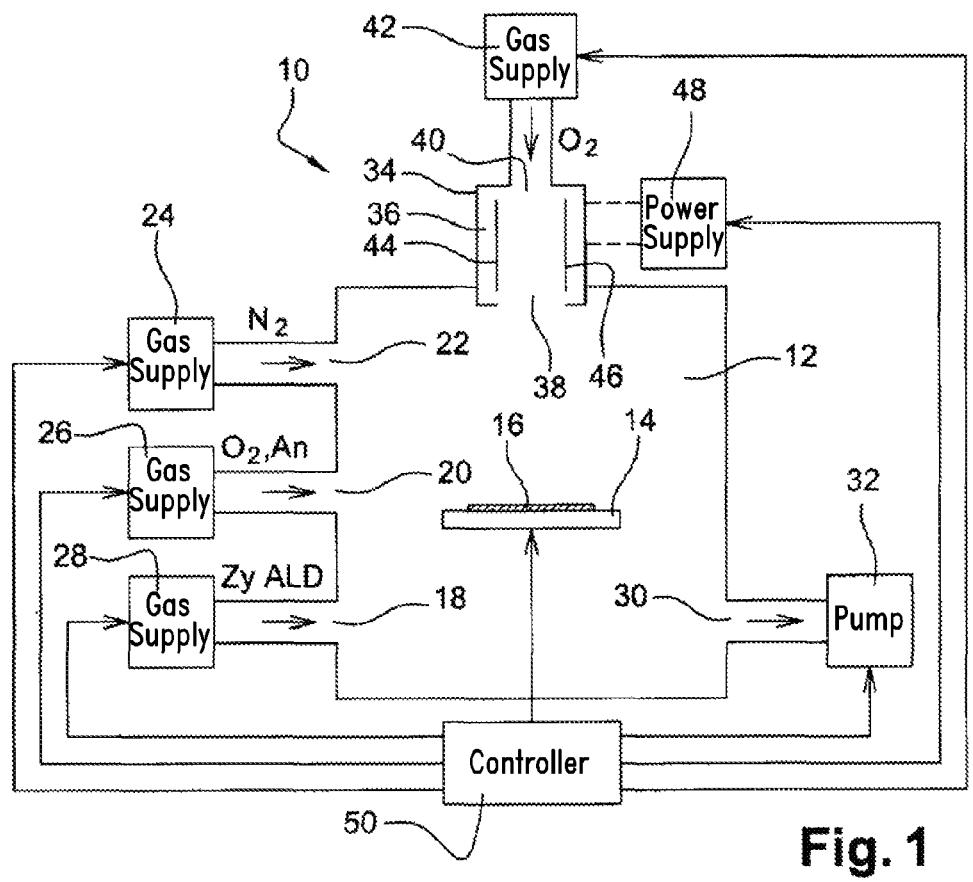
FIG. 1 is a schematic view of a first example of a PEALD deposition system.

FIG. 1 shows a first example of a PEALD system 10 for manufacturing a polycrystalline dielectric layer, such as a polycrystalline dielectric oxide layer, on a metal substrate 16—a capacitor electrode for example, and more particularly a polycrystalline layer made of a single dielectric oxide and having a crystallization rate greater than 70 percent, and preferably greater that 80 percent.

System 10 comprises a hermetically sealed reaction vessel 12 in which a plate 14 is placed in order to accommodate metal substrate 16. Plate 14 comprises controllable means of adjusting its temperature (not shown) such as a heating resistance. Other means of heating can be envisaged such as heating by lamps for example.

Reaction vessel 12 has a first inlet opening 18 for feeding in a first precursor of the dielectric oxide that is to be deposited, a second inlet opening 20 for feeding in a second precursor of the dielectric oxide that is to be deposited and a third inlet opening 22 for feeding in the purge gas. Each of openings 18, 20, 22 is connected to a controllable gas supply unit 24, 26, 28 which adjusts the flow rate and feed time of each of the gases that are fed into reaction vessel 12.

An exhaust opening 30 is also provided in reaction vessel 12 and is connected to a controllable pump unit 32 which comprises a butterfly valve used to regulate the pressure of the gases inside reaction vessel 12. Pump unit 30 is also provided in order to purge reaction vessel 12.

System 10 also comprises a plasma production unit 34 for delivering plasma above substrate 16. For example, plasma production unit 34 comprises an internal chamber 36 having an opening 38 for feeding plasma into reaction vessel 12, an inlet opening 40 for a gas which is used to form the plasma, said opening 40 being connected to a controllable supply unit 42 which adjusts the flow rate and the time for which this gas is fed into chamber 36. The plasma is formed by subjecting the gas in chamber 40 to electric discharges produced by a discharge circuit comprising, for instance, parallel planar electrodes 44, 46 between which the plasma is formed, said discharge circuit being connected, in order to power it, to a controllable power supply unit 48 which outputs a radio-frequency electrical signal. As is known, a plasma is usually characterized by the electric power delivered to the discharge circuit which is commonly referred to as the "plasma power".

Finally, PEALD system 10 comprises a control unit 50 which is connected to gas supply units 24, 26, 28, 42, plate 14, the electrical power supply unit 48 and pump unit 32 in order to control their operation.

Figure 2:
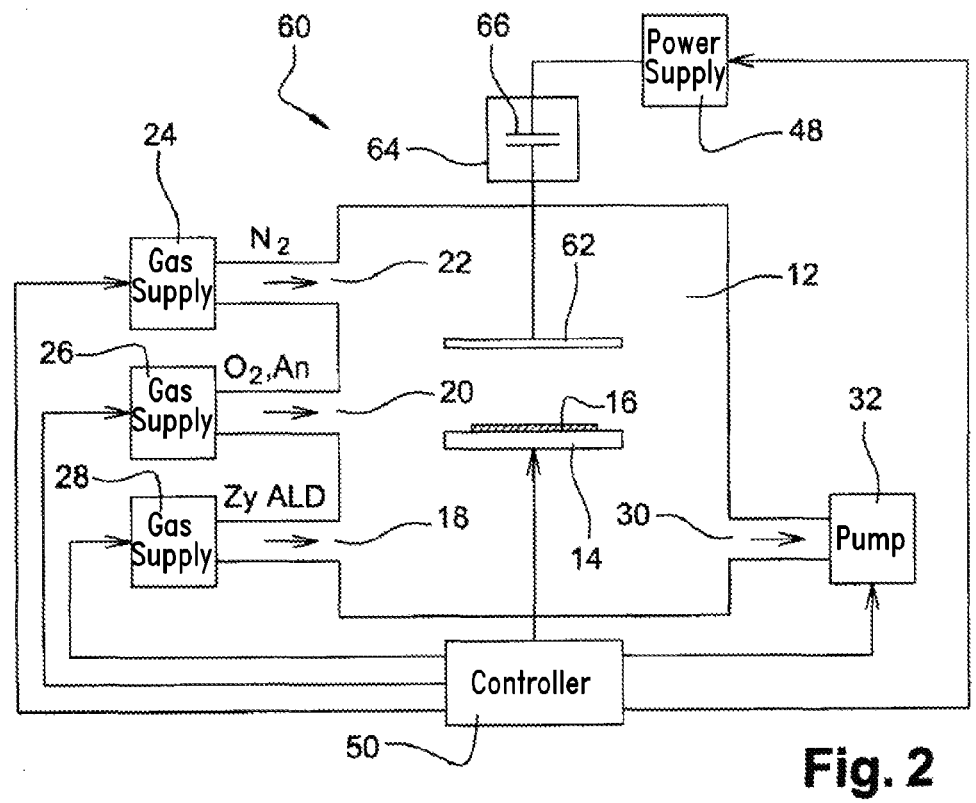
FIG. 2 is a schematic view of a second example of a PEALD system.

FIG. 2 is a schematic view of a second example of a PEALD system 60. System 60 differs from first system 10 described above in terms of its plasma production unit. In this second example, the plasma production unit comprises an electrode 62 placed inside reaction vessel 12 above plate 14. Plate 14 is metallic and thus constitutes a second electrode and is connected to ground. Electrode 62 is connected to a capacitive discharge circuit 64, for example a capacitor 64, which is itself electrically connected to controllable electricity power supply unit 48 which delivers radio-frequency energy to capacitive circuit 64 as a function of a command generated by control unit 50.

Referring to FIG. 3, control unit 50 controls the units described above so that PEALD deposition of a dielectric oxide layer on metal substrate 16 includes a succession of elementary cycles which each produce an atomic dielectric oxide layer. Each of the elementary cycles successively comprises:

a phase in which the first precursor, for example a precursor of a transition metal that is part of the composition of the dielectric oxide layer, is fed into reaction vessel 12 at a predetermined flow rate for a predetermined time;

a phase in which the gases and residues in reaction vessel 12 are purged;

a phase in which the second precursor, for example an oxidation precursor, is fed into reaction vessel 12 at a predetermined flow rate for a predetermined time;

a wait phase in order to stabilize the gaseous phase above metal substrate 16;

a phase in which plasma is fed into reaction vessel 12 with a predetermined plasma power for a predetermined time; and a wait phase or purge phase in which the gases and residues in reaction vessel 12 are purged.

In order to limit or even prevent penetrating grain boundaries, an elementary cycle according to a first profile is first repeated a predetermined number $N_1$ of times. The profile of the elementary cycle is then modified and the modified elementary cycle is repeated a predetermined number $N_2$ of times, and so on. Each sequence of identical elementary cycles is thus a polycrystalline growth cycle. In FIG. 2, for example, the profile of the elementary cycle is modified three times and the modification relates to the characteristics of the phase in which the first precursor is fed into reaction vessel 12, in particular its duration, and the characteristics of the phase in which plasma is fed into reaction vessel 12, in particular its duration and/or the plasma power.

Modifying the profile of the elementary cycles thus has the effect of modifying the growth conditions of the crystals in the metallic oxide layer and hence varying the polycrystalline properties of said oxide through the thickness of said layer, for example the arrangement of the crystals relative to each other or even their size, and this stops any development of grain boundaries which may have started to develop. Furthermore, this modification does not substantially modify the crystallization rate, which does not substantially vary, or varies little, according to the thickness of the polycrystalline dielectric oxide layer. More particularly, the crystallization rate variation between two successive elementary cycles is less than 10 percent, and preferably less than 5 percent.

Advantageously, modifying the profile of the elementary cycle affects the:
  duration and flow rate in the precursor feed phases;
  duration of the plasma feed phase;
  plasma power;
  the type of precursor, various precursors that produce the same dielectric material deposited on element 16 can be alternated; and
  temperature of plate 14 and hence element 16.

The inventors have noted that varying these parameters results in better limitation of penetrating grain boundaries.

FIG. 4 shows an example of a dielectric oxide layer 70 manufactured between two metal electrodes 72, 74 by modifying the profile of the elementary cycles five times, thereby forming six strata 76, 78, 80, 82, 84, 86 of dielectric oxide with the polycrystalline properties of one stratum being different to the crystalline properties of the adjacent stratum. It is apparent that the deposition conditions applied in order to obtain one stratum cause the formation of grain boundary 88 in said stratum in given locations. However, because modifying the deposition conditions gives rise to an adjacent stratum having different polycrystalline properties, the grain boundaries in this adjacent stratum form in different locations or the probability of them forming as an extension of the grain boundaries in the stratum that has already been formed is extremely low. Ultimately, the probability that modifying deposition conditions several times will give rise to the formation of grain boundaries that are extensions of each other is extremely low or virtually zero.

A particular embodiment for manufacturing a layer of $ZrO_2$ on a metal electrode, for example an electrode made of TiN, by using PEALD is described below.

Firstly, the following deposition conditions are used to obtain a layer of polycrystalline $ZrO_2$ using PEALD:
  a substrate temperature $T_S$ within the range $\Delta T_{S1}$=[100° C.; 300° C.], preferably a substrate temperature $T_S$ within the range $\Delta T_{S2}$=[200° C.; 250° C.], preferably a temperature $T_S$ substantially equal to 250° C.;
  a total pressure $P_T$ in reaction vessel 12 within the range $\Delta P_T$=[0.1 torr; 50 torrs], preferably a total pressure $P_T$ substantially equal to 5 torrs;
  a first precursor, that for Zr, is chosen from the following:
    tris(dimethylamino)cyclopentadienylzirconium (more widely known as "ZyALD");
    bis(methylcyclopentadienyl)methoxymethylzirconium (more widely known as "ZrD-04"); and
    tetrakis[EthylMethylAmino]zirconium (more widely known as "TEMAZ");
  with ZyALD being preferred;
  a feed time $D_{P1}$ for reaction vessel 12 for the first precursor within the range $\Delta D_{P1}$=[100 ms; 5 s], with a preferred feed time $D_{P1}$ substantially equal to 500 ms;
  a partial pressure $P_{PP1}$ of the precursor of Zr within the range $\Delta P_{PP1}$=[0.001 torr; 10 torrs], with a preferred partial pressure $P_{PP1}$ substantially equal to 0.01 torr;
  dioxygen ($O_2$) as the second precursor. Advantageously $O_2$ is injected into reaction vessel 12 together with argon (Ar) which is used to dilute the $O_2$ and stabilize the plasma;
  a partial pressure $P_{PP2}$ of the $O_2$ within the range $\Delta P_{PP2}$=[0.01 torr; 5 torrs], with a preferred partial pressure $\Delta P_{PP2}$ substantially equal to 0.1 torr;
  for a plasma obtained using plasma power $P_W$ within the range $\Delta P_W$=[20 W; 2000 W] with circular, planar electrodes having a diameter of 350 mm that are parallel to each other and spaced 1 cm apart, with a preferred plasma power $P_W$ substantially equal to 100 W; and
  a plasma feed time $D_W$ within the range $\Delta D_W$=[50 ms; 5 s], with a preferred plasma feed time $D_W$ substantially equal to 1 s.

Note that each of the above parameters has a significant variability, making it possible to modify them considerably while still guaranteeing that a polycrystalline layer will be obtained. More particularly, a high crystallization rate is obtained, greater than 70 percent, e.g. 90 percent, with a high homogeneity of said rate. Indeed, the crystallization rate is substantially constant from one cycle to another, with variation of said rate being less than 10 percent.

In addition, it has been observed that the values stated above provide good controllability and highly reproducible deposition conditions. Also, it has been observed that the preferred values stated above ensure maximum deposition efficiency because, for every five molecules of the precursor of Zr injected into reaction vessel 12, one is effectively involved in depositing an atomic layer on substrate 16.

An example of a sequence for manufacturing a layer of polycrystalline $ZrO_2$ without any grain boundaries is described below:
  one elementary cycle repeated $N_1$ times according to the following first profile:
    the first precursor is ZyALD;
    $D_{P1}$=100 ms;
    the values $T_S$, $P_T$, $P_{PP1}$, $P_{PP2}$, $P_W$, $D_W$ are within their respective ranges and are preferably equal to their preferred values;
  followed by an elementary cycle repeated $N_2$ times according to the following second profile:
    the first precursor is ZyALD;
    $D_{P1}$=1 s;
    the values $T_S$, $P_T$, $P_{PP1}$, $P_{PP2}$, $P_W$, $D_W$ are within their respective ranges and are preferably equal to their preferred values;
  followed by an elementary cycle repeated $N_3$ times according to the following third profile:
    the first precursor is ZyALD;
    DW=5s;

the values TS, $\underline{P_T}$, $\underline{P_{PP1}}$, $\underline{P_{PP2}}$, $\underline{P_W}$, $\underline{D_{P1}}$ are within their respective ranges and are preferably equal to their preferred values;

followed by an elementary cycle repeated $\underline{N_4}$ times according to the following fourth profile:
the first precursor is ZyALD;
$\underline{P_W}$=2000 W;
the values $\underline{T_S}$, $\underline{P_T}$, $\underline{P_{PP1}}$, $\underline{P_{PP2}}$, $\underline{D_W}$, $\underline{D_{P1}}$ are within their respective ranges and are preferably equal to their preferred values;

optionally, followed by an elementary cycle repeated $\underline{N_5}$ times according to the following fifth profile:
the first precursor is ZrD-04 or TEMAZ;
the values $\underline{T_S}$, $\underline{P_T}$, $\underline{P_{PP1}}$, $\underline{P_{PP2}}$, $\underline{D_W}$, $\underline{D_{P1}}$, $\underline{P_W}$ are within their respective ranges and are preferably equal to their preferred values.

Also note that, besides the possibility of limiting or even preventing the occurrence of penetrating grain boundaries, there is a degree of freedom when it comes to choosing the sizes of the crystals in the layer of $ZrO_2$ and the elementary thickness that is deposited per elementary cycle. In particular, it is possible to manufacture small-sized crystals, i.e. crystals having dimensions equal to or less than 1 nanometer, which have the advantage of constituting a cubic or tetragonal crystalline phase which has a high dielectric constant.

Thus, the value ranges described above make it possible to manufacture a layer of $ZrO_2$ having an elementary deposited thickness per elementary cycle that varies from 0.1 Å to 1.5 Å. The conditions are preferably also chosen so as to obtain an elementary deposited thickness per elementary cycle in excess of 1 Å so that the deposition rate is appropriate to the manufacturing speeds that achieve industrial-scale production.

In particular, the following deposition conditions make it possible to obtain small-sized crystals with a deposited thickness of 1.5 Å per elementary cycle:
a partial $O_2$ pressure of 0.1 torr;
a reaction-vessel plasma feed time of 200 ms;
a plasma power of 100 W;
a total pressure in the reaction vessel of 5 torrs; and
A substrate temperature equal to 200° C.

In particular, the following deposition conditions make it possible to obtain large-sized grains, i.e. grains having dimensions from 5 nm to 10 nm, with a deposited thickness of 1 Å per elementary cycle:
a partial $O_2$ pressure of 0.5 torr;
a reaction-vessel plasma feed time of 1 s;
a plasma power of 500 W; and
a substrate temperature equal to 250° C.

In the example described above, modifying the operation of the PEALD deposition changes the feed time for the first precursor of Zr, the type of the latter, the plasma power and the plasma feed time. The inventors have actually confirmed that these parameters make it possible to modify the way in which the crystals grow and arrange themselves very substantially and are therefore parameters that enable extensive diversity of the polycrystalline properties of the deposited dielectric oxide. By modifying these parameters alone, it is thus possible to limit the occurrence of penetrating grain boundaries very substantially.

More especially, the inventors have observed that making provision for modifying one or more of these parameters when a thickness of dielectric oxide of less than 5 nanometers is deposited and, preferably, a thickness substantially equal to 1 nanometer, prevents the occurrence of penetrating grain boundaries. From the average elementary thickness deposited per elementary cycle, it was then easy to deduce the number of times that an elementary cycle had to be repeated in accordance with a predetermined profile.

Obviously, the other parameters can also be used to control the occurrence of penetrating grain boundaries and may therefore also be modified in order to limit the occurrence of penetrating grain boundaries.

An embodiment for manufacturing a layer of polycrystalline dielectric oxide on a metal electrode which limits, or even prevents, the occurrence of penetrating grain boundaries by using PEALD is described above. Such deposition is advantageous assuming the manufacturer has control of the two types of parameters that are important in order to control the occurrence of grain boundaries, namely those that affect feeding the precursor of Zr into the reaction vessel and those that affect the plasma.

Other types of manufacturing are nevertheless possible. For example, using Atomic Layer Deposition (ALD) and modifying the operating conditions of the ALD deposition during manufacture of a layer of polycrystalline dielectric oxide also make it possible to limit the occurrence of penetrating grain boundaries. ALD differs from PEALD in particular by virtue of the absence of plasma and the type of oxidizing precursor that is used, with the other operating conditions described above continuing to apply. In particular, the oxidizing precursors are chosen from chemical species that are more reactive than dioxygen and include, for instance, water ($H_2O$) or trioxygen (ozone) ($O_3$). It is thus possible, for instance, to limit the occurrence of grain boundaries by modifying the time for which the precursor of Zr is fed into the reaction vessel and/or by changing the type of precursor of Zr and/or by changing the type of oxidizing precursor and/or by modifying the temperature of the substrate.

Similarly, using Chemical Vapor Deposition (CVD) and modifying the operating conditions of CVD during manufacture of a layer of polycrystalline dielectric oxide also make it possible to limit the occurrence of penetrating grain boundaries because such modification also involves modifying the growth of the crystals.

The manufacture of a layer of polycrystalline $ZrO_2$ is described in the embodiments described above. Obviously, other types of polycrystalline dielectric layers can also be manufactured, especially oxide layers made of other transition metals such as, for example, hafnium oxide ($HfO_2$) or even a layer of $SrTiO_3$, with their manufacture being performed in ways similar to those described above.

Also, a method for manufacturing a dielectric layer that forms part of a capacitor is described above. The manufacturing method described above is applicable to any type of polycrystalline dielectric layer, especially a dielectric oxide, in which one wants to limit the occurrence of penetrating grain boundaries, such as, for example, transistor gate oxide layers, dielectric layers that form part of a Metal-Insulator-Metal (MIM) structure or DRAM structure for example, especially eDRAM structures.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a dielectric layer that includes:
   a first polycrystalline dielectric sublayer of a molecular material, the first polycrystalline dielectric sublayer having a first polycrystalline structure and a first crystallization rate; and
   a second polycrystalline dielectric sublayer of the molecular material directly on the first polycrystalline sublayer, the second polycrystalline dielectric sublayer having a second polycrystalline structure and a second crystallization rate that is different than the first crystallization rate and within 10 percent of the first crystallization rate.

2. A device as claimed in claim 1, comprising:
   a capacitor that includes conductive electrodes on opposite sides of the dielectric layer.

3. A device as claimed in claim 1, wherein the dielectric layer is a dielectric metallic oxide.

4. A device as claimed in claim 1, wherein each sublayer has a thickness of less than 5 nanometers.

5. A device as claimed in claim 1, wherein the dielectric layer includes $ZrO_2$.

6. A device as claimed in claim 1, wherein the dielectric layer includes $HfO_2$.

7. A device as claimed in claim 1, wherein the dielectric layer includes $SrTiO_3$.

8. A device, comprising:
   a dielectric layer that includes:
   a first polycrystalline dielectric sublayer of a molecular material, the first polycrystalline dielectric sublayer having a first polycrystalline structure and a first plurality of grain boundaries; and
   a second polycrystalline dielectric sublayer of the molecular material directly on the first polycrystalline sublayer, the second polycrystalline dielectric sublayer having a second polycrystalline structure and a second plurality of grain boundaries that are not directly aligned with the respective grain boundaries of the first plurality.

9. A device as claimed in claim 8, comprising:
   a capacitor that includes conductive electrodes on opposite sides of the dielectric layer.

10. A device as claimed in claim 8, wherein the dielectric layer is a dielectric metallic oxide.

11. A device as claimed in claim 8, wherein each sublayer has a thickness of less than 5 nanometers.

12. A device as claimed in claim 8, wherein the dielectric layer includes $ZrO_2$.

13. A device as claimed in claim 8, wherein the dielectric layer includes $HfO_2$.

14. A device as claimed in claim 8, wherein the dielectric layer includes $SrTiO_3$.

15. A device, comprising:
    a dielectric layer that includes:
    a first polycrystalline dielectric sublayer of a molecular material, the first polycrystalline dielectric sublayer having a first polycrystalline structure and a first plurality of grain boundaries; and
    a second polycrystalline dielectric sublayer of the molecular material directly on the first polycrystalline sublayer, the second polycrystalline dielectric sublayer having a second polycrystalline structure and a second plurality of grain boundaries that are not directly aligned with the respective grain boundaries of the first plurality, the second polycrystalline dielectric sublayer having a second polycrystalline structure and a second crystallization rate that is different than the first crystallization rate and within 10 percent of the first crystallization rate.

16. A device as claimed in claim 15, comprising:
    a capacitor that includes conductive electrodes on opposite sides of the dielectric layer.

17. A device as claimed in claim 15, wherein each sublayer has a thickness of less than 5 nanometers.

18. A device as claimed in claim 15, wherein the dielectric layer includes $ZrO_2$.

19. A device as claimed in claim 15, wherein the dielectric layer includes $HfO_2$.

20. A device as claimed in claim 15, wherein the dielectric layer includes $SrTiO_3$.

21. A device as claimed in claim 15, wherein the dielectric layer is a dielectric metallic oxide.

* * * * *